United States Patent
Zha et al.

(10) Patent No.: US 12,114,091 B2
(45) Date of Patent: Oct. 8, 2024

(54) DELTA IMAGE SENSOR WITH DIGITAL PIXEL STORAGE USING DIFFERENT RAMPS FOR STORAGE AND COMPARISON

(71) Applicants: Beijing RuisiZhixin Technology Co., Ltd., Beijing (CN); Alpsentek GmbH, Zurich (CH)

(72) Inventors: Yingyun Zha, Regensdorf (CH); Roger Mark Bostock, Munsingen (CH); Jian Deng, Zurich (CH); Yu Zou, Zurich (CH)

(73) Assignees: Beijing Ruisizhixin Technology Co., Ltd, Beijing (CN); AlpsenTek GmbH, Zurich (CH)

( * ) Notice: Subject to any disclaimer, the term of this patent is extended or adjusted under 35 U.S.C. 154(b) by 14 days.

(21) Appl. No.: 18/002,798

(22) PCT Filed: Jun. 24, 2021

(86) PCT No.: PCT/EP2021/067338
§ 371 (c)(1),
(2) Date: Dec. 21, 2022

(87) PCT Pub. No.: WO2021/260105
PCT Pub. Date: Dec. 30, 2021

(65) Prior Publication Data
US 2023/0247327 A1    Aug. 3, 2023

(30) Foreign Application Priority Data

Jun. 26, 2020 (EP) .................................. 20182536

(51) Int. Cl.
*H04N 25/771* (2023.01)
*G06F 7/02* (2006.01)
(Continued)

(52) U.S. Cl.
CPC ............. *H04N 25/771* (2023.01); *G06F 7/02* (2013.01); *H03M 1/12* (2013.01); *H04N 25/40* (2023.01);
(Continued)

(58) Field of Classification Search
CPC ...... H04N 25/40; H04N 25/703; H04N 25/47; H04N 25/78; H04N 25/573; H04N 25/772;
(Continued)

(56) References Cited

U.S. PATENT DOCUMENTS

| | | | | |
|---|---|---|---|---|
| 6,940,589 | B1 * | 9/2005 | Suyama | G01J 1/44 250/370.06 |
| 7,679,654 | B2 * | 3/2010 | Shinotsuka | H04N 23/70 348/228.1 |

(Continued)

FOREIGN PATENT DOCUMENTS

| | | |
|---|---|---|
| EP | 2933995 A1 | 10/2015 |
| EP | 3313064 A1 | 4/2018 |

(Continued)

OTHER PUBLICATIONS

N. Tu et al., "CMOS active pixel sensor with combined linear and logarithmic mode operation", Proc. IEEE Canadian Conf. Electrical and Computer Engineering, 1998, pp. 754-757.

(Continued)

*Primary Examiner* — Pritham D Prabhakher
(74) *Attorney, Agent, or Firm* — Simpson & Simpson, PLLC

(57) ABSTRACT

A delta image sensor comprising a plurality of acquisition circuits corresponding to at least one pixel. Each acquisition circuit includes at least one sensor circuit comprising a photosensor to generate a sensor signal, VSIG, depending on a light signal illuminating the photosensor; at least one (Continued)

Figure 1:
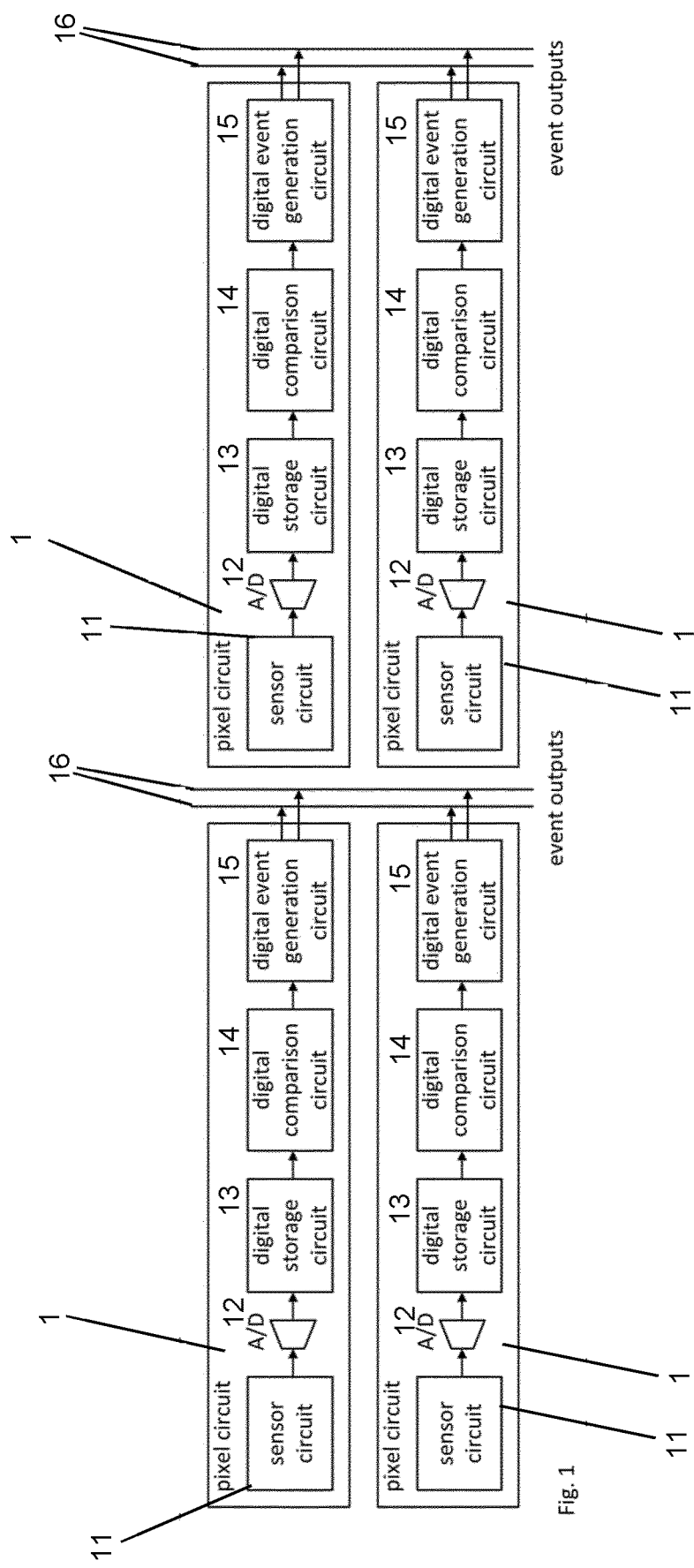

single slope analogue to digital conversion, A/D, circuit configured to convert a current VSIG to a digital signal, wherein the A/D circuit (12) is configured to use one of a plurality of ramps for the conversion; at least one digital storage circuit configured to store a representation of at least one digital signal corresponding to a previous VSIG; at least one digital comparison circuit configured to compare the level of the stored representation with the current VSIG to detect whether a changed level is present; and at least one digital output circuit configured to generate an event output, in response to the changed level.

21 Claims, 4 Drawing Sheets

(51) Int. Cl.
    *H03M 1/12*       (2006.01)
    *H04N 25/40*     (2023.01)
    *H04N 25/47*     (2023.01)
    *H04N 25/703*    (2023.01)
    *H04N 25/766*    (2023.01)
    *H04N 25/772*    (2023.01)
    *H04N 25/78*     (2023.01)
    *H04N 25/79*     (2023.01)

(52) U.S. Cl.
    CPC .......... *H04N 25/47* (2023.01); *H04N 25/703* (2023.01); *H04N 25/766* (2023.01); *H04N 25/772* (2023.01); *H04N 25/78* (2023.01); *H04N 25/79* (2023.01)

(58) Field of Classification Search
    CPC .... H04N 25/771; H04N 25/766; H04N 25/79; G06F 7/02; H03M 1/12
    USPC ........................................................ 348/302
    See application file for complete search history.

(56) References Cited

U.S. PATENT DOCUMENTS

| | | | |
|---|---|---|---|
| 7,728,269 B2 | 6/2010 | Lichtsteiner et al. | |
| 8,780,240 B2* | 7/2014 | Posch | H04N 25/00 348/297 |
| 8,847,169 B2* | 9/2014 | Yuan | G01T 1/249 250/370.08 |
| 9,767,258 B2* | 9/2017 | Simpson | G01J 1/16 |
| 9,838,635 B2* | 12/2017 | Gousev | G06V 10/507 |
| 9,854,178 B2* | 12/2017 | Taniguchi | H04N 25/585 |
| 9,961,291 B2 | 5/2018 | Chen | |
| 9,967,479 B2* | 5/2018 | Matolin | H04N 23/71 |
| 10,218,922 B2 | 2/2019 | Kondo et al. | |
| 10,491,231 B2* | 11/2019 | Liobe | H03M 1/1205 |
| 10,567,679 B2* | 2/2020 | Berner | H04N 25/47 |
| 10,721,423 B2 | 7/2020 | Finateu et al. | |
| 10,728,450 B2* | 7/2020 | Govil | H04N 25/77 |
| 10,811,447 B2* | 10/2020 | Hanzawa | H04N 25/57 |
| 10,904,465 B2* | 1/2021 | Finateu | H04N 25/772 |
| 10,911,093 B2* | 2/2021 | Yu | H04J 14/02 |
| 10,969,273 B2* | 4/2021 | Berkovich | H03M 1/56 |
| 11,140,349 B2* | 10/2021 | Suh | H04N 25/77 |
| 11,169,249 B2* | 11/2021 | Guruprasad | G01S 17/006 |
| 11,202,041 B2 | 12/2021 | Kindo | |
| 11,418,208 B2* | 8/2022 | Ranganathan | G01J 1/46 |
| 11,825,229 B2* | 11/2023 | Brändli | H04N 25/75 |
| 2005/0225649 A1* | 10/2005 | Shinotsuka | H04N 23/70 348/226.1 |
| 2010/0182468 A1 | 6/2010 | Posch et al. | |
| 2011/0169990 A1 | 7/2011 | Higuchi et al. | |
| 2011/0291019 A1 | 12/2011 | Yuan et al. | |
| 2013/0275054 A1* | 10/2013 | Simpson | G01J 1/42 702/26 |
| 2015/0035949 A1 | 2/2015 | Rouh et al. | |
| 2015/0358570 A1 | 12/2015 | Taniguchi | |
| 2016/0093273 A1 | 3/2016 | Wang et al. | |
| 2016/0094787 A1 | 3/2016 | Govil et al. | |
| 2016/0094800 A1 | 3/2016 | Gousev et al. | |
| 2016/0227135 A1 | 8/2016 | Matolin et al. | |
| 2018/0013969 A1* | 1/2018 | Chen | H04N 25/77 |
| 2018/0152644 A1* | 5/2018 | Kondo | H01L 27/14643 |
| 2018/0191972 A1 | 7/2018 | Berner et al. | |
| 2018/0191982 A1 | 7/2018 | Berner et al. | |
| 2019/0051680 A1 | 2/2019 | Hanzawa et al. | |
| 2019/0260384 A1 | 8/2019 | Liobe et al. | |
| 2019/0273884 A1* | 9/2019 | Finateu | H04N 25/77 |
| 2019/0285468 A1* | 9/2019 | Berkovich | G01J 1/46 |
| 2019/0340452 A1 | 11/2019 | Asayama et al. | |
| 2020/0014418 A1 | 1/2020 | Yu et al. | |
| 2020/0068149 A1 | 2/2020 | Finateu et al. | |
| 2020/0084403 A1 | 3/2020 | Suh et al. | |
| 2020/0344451 A1* | 10/2020 | Kindo | H04N 25/47 |
| 2022/0303490 A1 | 9/2022 | Chen | |

FOREIGN PATENT DOCUMENTS

| | | |
|---|---|---|
| EP | 3955566 A1 | 2/2022 |
| FR | 2976918 A1 | 12/2012 |
| JP | 8-122149 A | 5/1996 |
| JP | 2009508085 A | 12/2006 |
| JP | 2009111666 A | 5/2009 |
| JP | 2010-510732 A | 4/2010 |
| JP | 2012015923 A | 1/2012 |
| JP | 2015-501936 A | 1/2015 |
| JP | 2015170863 A | 9/2015 |
| JP | 2016-533140 A | 10/2016 |
| JP | 2018067776 A | 10/2016 |
| JP | 2017046259 A | 3/2017 |
| JP | 2018501675 A | 1/2018 |
| JP | 2020016654 A | 1/2020 |
| JP | 2020507974 A | 3/2020 |
| JP | 2019536389 A | 5/2022 |
| KR | 2020/0029328 A | 3/2020 |
| WO | 2014/174498 A1 | 10/2014 |
| WO | 2015/036592 A1 | 3/2015 |
| WO | 2017/009944 A1 | 1/2017 |
| WO | 2017/158483 A1 | 9/2017 |
| WO | 2017150240 A1 | 9/2017 |
| WO | 2017/174579 A1 | 10/2017 |
| WO | 2018/122800 A1 | 7/2018 |
| WO | 2020/080383 A1 | 4/2020 |
| WO | 2020110537 A1 | 6/2020 |
| WO | 2020/229980 A1 | 11/2020 |
| WO | 2020/0229981 A1 | 11/2020 |
| WO | 2021/017766 A1 | 2/2021 |

OTHER PUBLICATIONS

J. Guo et al., 2008, Sensors, 2008 IEEE.
Lichtsteiner et al., 2008, IEEE Journal of Solid-State Circuits, vol. 43, No. 2, Feb. 2008.
Chou et al., 2012, Sensors, 2012 IEEE.
S.D. Freedman, 2015, 2nd International Conference on Knowledge-Based Engineering and Innovation (KBEI).
M. Goto et al., 2016, 2016 IEEE SOI-3D-Subthreshold Microelectronics Technology Unified Conference.
Tobi Delbruck "Frame-Free Dynamic Digital Vision" Proceedings of the International Conf. on Secure-Life Electronics, Advanced Electroncis for Quality Life and Society, Mar. 7, 2008, pp. 21-26.
Christian Reckleben, Karsten Hansen, Senior Member, IEEE, Pradeep Kalavakuru, Janusz Szymanski, Florian Erdinger, Peter Fischer, Manfred Kirchgessner, and Jan Soldat; A 64-by-64 Pixel-ADC Matrix; 2015 IEEE.
Suarez et al. 2010; In-Pixel ADC for a Vision Architecture on CMOS-3D Technology.
Yu M. Chi, Student Member, IEEE, Udayan Mallik, Matthew A. Clapp, Edward Choi, Gert Cauwenberghs, Senior Member, IEEE, and Ralph Etienne-Cummings, Member, IEEE; IEEE Journal of Solid-State Circuits, vol. 42, No. 10, Oct. 2007; CMOS Camera With In-Pixel Temporal Change Detection and ADC.

(56) References Cited

OTHER PUBLICATIONS

Itoh et al., "4-Layer 3-D IC with a function of parallel signal processing", Microelectronic engineering, vol. 15, No. 1-4, 1991, pp. 187-190.
Christian Brandli, StudentMember, IEEE, Raphael Berner, Member, IEEE, MinhaoYang, Student Member, IEEE, Shih-Chii Liu, Senior Member, IEEE, and Tobi Delbruck, Fellow, IEEE; A 240 × 180 130 dB 3 US Latency Global Shutter Spatiotemporal Vision Sensor; IEEE Journal of Solid-State Circuits, vol. 49, No. 10, Oct. 2014.
Gallego et al.: "Event-based Vision: A Survey", IEEE Transactions on Pattern Analysis and Machine Intelligence, 2020, arXiv:1904.08405v3.
Background Subtraction: Theory and Practice, Ahmed Elgammal, ISBN 1627054405; Copyright 2015.
Pending claims from U.S. Appl. No. 17/606,251—Preliminary Amendment; Pending as of Mar. 20, 2023.
Pending claims from U.S. Appl. No. 18/002,780—Preliminary Amendment; Pending as of Mar. 20, 2023.
Pending claims from U.S. Appl. No. 18/002,792—Preliminary Amendment; Pending as of Mar. 20, 2023.
Pending claims from U.S. Appl. No. 18/002,876—Preliminary Amendment; Pending as of Mar. 20, 2023.
Pending claims from U.S. Appl. No. 18/003,011—Preliminary Amendment; Pending as of Mar. 20, 2023.
Biyin et al., "An In-Pixel Gain Amplifier Based Event-Driven Physical Unclonalbe Function for CMOS Dynamic" 2019 IEEE International Symposium on Circuits and Systems (ISCAS), IEEE, May 26, 2019, pp. 1-5.

\* cited by examiner

DELTA IMAGE SENSOR WITH DIGITAL PIXEL STORAGE USING DIFFERENT RAMPS FOR STORAGE AND COMPARISON

REFERENCE TO RELATED APPLICATION

This application is a U.S. National Stage filing of International Application PCT/EP2021/067338, titled "DELTA IMAGE SENSOR WITH DIGITAL PIXEL STORAGE USING DIFFERENT RAMPS FOR STORAGE AND COMPARISON", filed Jun. 24, 2021, which claim benefit of priority of European Patent Application Number EP 20182536.1 filed on Jun. 26, 2020, each of which is hereby incorporated by reference herein in its entirety.

The present invention relates to an image sensor comprising a plurality of pixel circuits, in particular an image sensor using different ramps for analogue to digital conversion for storage and comparison of a representation of sensor signals.

Image sensors with one ADC per pixel, or per small sub-set of pixels, are well known. These are typically used in applications (e.g. X-ray particle track tracing or satellite imaging) where significant processing is carried out in the pixel.

Image sensors with a single-slope ADC where each pixel includes a comparator are known, e.g. Reckleben et al., 2015, Suarez et al., 2010 and Chi et al., 2010. In particular, Suarez et al. create an analogue slope and digital code globally for the pixel arrangement and provide a digital code to the pixel.

Image sensors where the digital value is stored inside the pixel and compared between samples to create event change data are not known. The current invention enables an area optimised small pixel structure producing a high resolution and cost optimised sensor.

Image sensors, where a representation of the previous illumination level is digitally stored in the pixel and compared between samples to create event change data, are known from WO 2014/174498 A1, while Itoh et. al, "4-Layer 3-D IC with a function of parallel signal processing", Microelectronic engineering, vol 15, no. 1-4, 1991, pages 187-190, earlier proposed a conceptually related structure with a simple single bit pixel comparison to a fixed level.

Image sensors with event generation using image pixel level change detection, storage and comparison in the analogue domain are known, e.g. Chi et. al, "CMOS Camera With In-Pixel Temporal Change Detection and ADC", IEEE Journal of Solid-State Circuits, vol. 42, no. 10, 2007, pages 2187-2196. Comparison and storage in the analogue domain provides advantages over a digital approach (e.g. compact realisation) and disadvantages (e.g. gradual storage degradation, including "hot-pixels", sensitivity to mismatch, reduced flexibility of light to electric conversion function).

Image sensors, which share circuitry between pixels, are well known, e.g. KR 2020-0029328 A.

The use of stroboscopic effects is generally known, as well as the suppression of harmonics by averaging or synchronising over a period of a disturbance (unwanted signal), e.g. US 2015/358570 A1, where the technique is applied in a camera to detect and synchronise to a variable light source and then to suppress the response to the light source.

WO 2020/080383 A1 discloses an event based dynamic vision sensor with a filter to ignore events from one pixel, based on the event status (single bit) of adjacent pixels.

T. Delbruck "Frame-free dynamic digital vision", Proceedings of the International Conference on Secure Life Electronics, Advanced Electronics for Quality Life and Society, 2008, page 21-26, discloses to filter events from a dynamic vision sensor based on the time-stamp of the last event of that pixel, or the time-stamp of adjacent pixels. This processing is carried out outside the pixel array requiring transmission of the events out of the array for subsequent filtering, in a computationally expensive manner (32 bit time-stamps).

EP 3 313 064 A1 discloses an analogue storage dynamic vision sensor, where one comparator input is a representation of the previous value of the pixel illumination, which is then later used for comparison. This can be considered analogue feedback from the previous level to control the subsequent function of the analogue comparator, which is enabled (sampled), when a digital event output is created.

EP 2 933 995 A1 address the issues of poor mismatch in the standard analogue storage implementation of the dynamic vision sensors using transistors in sub-threshold operation. As operation in this transistor mode only functions correctly over a limited range, they use global analogue feedback to the analogue part of the acquisition circuits of the entire array to obtain satisfactory operation.

WO 2020/229981 A1, amongst others, present an approach to use multiple ramps as an integral part of slope based ADC operation. A conversion is first done against a coarse ramp with a large amplitude and subsequently against a fine ramp with a smaller amplitude, where the range of the fine ramp is selected by the result of the first ramp. The fine ramp can be understood as a zoom of the coarse ramp and the approach can be used to accelerate the ADC conversion.

There may be a need for a delta image sensor comprising an improved pixel circuit having a digital storage of a representation of the prior illumination intensity in the pixel.

Such a need may be met with the subject-matter of the independent claims. Advantageous embodiments are defined in the dependent claims.

Ideas underlying embodiments of the present invention may be interpreted as being based, inter alia, on the following observations and recognitions:

CMOS (Complementary metal oxide silicon) image sensors are produced in optimised foundry processes in high volume in specialised processes. CMOS digital logic devices are produced in optimised foundry processes in high volume. The density of both processes is increasing, in particular the density of the logic processes. The increased density permits increased digital complexity related to a pixel circuit in an image sensor.

Digital storage of a prior level in a pixel circuit has advantages in the fidelity of the storage and in the subsequent processing of the stored level.

Local processing of the levels has efficiency advantages in power and area as the propagation and processing of redundant data is limited.

This invention discloses a structure and method in which digital conversion and storage are combined in pixel circuits together with local evaluation of the differences over time and location and preparation and propagation of event information.

The invention is defined in the independent claims. Dependent claims describe preferred embodiments thereof.

The present invention relates to a delta image sensor comprising an arrangement of pixels and a plurality of acquisition circuits corresponding to at least one pixel and formed as part of an integrated circuit. Each acquisition circuit includes at least one sensor circuit comprising a photosensor configured to generate a sensor signal, VSIG, depending on a light signal illuminating the photosensor of the at least one pixel and at least one analogue to digital, A/D, conversion circuit configured to generate a digital representation corresponding to a current VSIG, wherein the A/D circuit (12) is configured to use one of a plurality of ramps for the analogue to digital conversion. Preferably, the A/D conversion circuit is a one single slope A/D circuit (12). At least one digital storage circuit is configured to store a representation of at least one previous VSIG, being generated by using a storage ramp. At least one digital comparison circuit is configured to compare the level of the stored representation with the current VSIG, being generated by using a storage ramp, to detect whether a changed level is present. At least one digital output circuit is configured to generate an event output under the condition of the changed level.

Various embodiments may preferably implement the following features:

According to an aspect of the invention a relationship between an analogue swept signal and a digital code is changed between a storage ramp and a comparison ramp and/or wherein the storage ramp and the comparison ramp have a fixed voltage difference.

According to another aspect of the invention a relationship between an analogue swept signal and a digital code is changed between a storage ramp and a comparison ramp and/or wherein the storage ramp and the comparison ramp have a variable voltage difference depending on the voltage level of VSIG.

According to another aspect of the invention the use of the storage ramp and the comparison ramp is reversed by the pixel depending on the pixel state, i.e. the previous event output polarity or any previous digital result. Typically, the different pixel state corresponds to a different previous event output polarity, or preferably any different previous digital result.

According to another aspect of the invention one or more storage ramps and one or more comparison ramps are applied and used by the pixels, depending on their pixel state, to provide multiple difference functions.

According to another aspect of the invention one or more storage ramps and one or more comparison ramps are applied and used by the pixels, independent of their state, to provide multiple difference functions.

According to another aspect of the invention the digital comparison circuit is configured to carry out the comparison of the level of the stored representation with the current VSIG during the ramp preferably without memorization of the compared digital value during the ramp.

According to another aspect of the invention the digital comparison circuit is configured to carry out the comparison of the level of the stored representation with the current VSIG after the ramp preferably with memorization of the digital comparison value during the ramp.

Each acquisition circuit may be formed as an integrated circuit or part of an integrated circuit. The acquisition circuit may also be referred to as pixel circuit throughout the specification. The at least one sensor circuit may continuously or periodically generate a sensor signal. The analogue to digital conversion circuit may convert a current VSIG to a digital signal. The digital storage circuit may accordingly be configured to store a representation of at least one digital signal corresponding to a previous VSIG. The digital representations of a current and a previous VSIG may be compared by the at least one digital comparison circuit. The previous VSIG, or digital representation of the VSIG, respectively, may correspond to a signal generated in any previous sample period and stored in the digital storage circuit. It may also be provided externally and stored as a reference signal. Also, at least one event output line may be comprised in the circuit to output the event output from the delta image sensor. The at least one event output line may also be shared by multiple digital output circuits.

Preferably, each acquisition circuit is shared between at least two pixels, wherein preferably the pixels are adjacent to each other.

Preferably, the sensor circuit is configured to generate VSIG based on one of the following relationships:
a) a linear dependency on the light intensity,
b) a non-linear, preferably logarithmic, dependency on the light intensity, and
c) a combination of a non-linear and a linear dependency on the light intensity, wherein preferably the relationship is changeable in response to a control signal.

The control signal may be provided from outside the array of pixels and acquisition circuits. There may be one control signal for the whole array, or more targeted.

Preferably, the sensor circuit is configured to change the dependency of VSIG on the light intensity in response to a control signal during operation, preferably from time to time, and/or the sensor circuit is configured to change the dependency of VSIG on the light intensity in response to a control signal during operation individually for at least one pixel or a subset of pixels.

The control signal changes from time to time may result from a change of global light intensity or operating mode. There may be provided a separate circuit for generating control signal changes from time to time.

The image sensor may preferably further implement the following features:
a) the analogue to digital conversion circuit may comprise a comparator, which is configured to compare the VSIG with one of the following swept signals:
aa) a swept analogue input signal, and
ab) sequential swept analogue input signals, where each of the swept analogue signals provides a different difference function,
wherein preferably the input signal is provided for a plurality of conversion circuits, and/or
b) the analogue to digital conversion circuit may be further configured to provide at least one digital code in parallel to the swept analogue signal to at least one pixel,
ba) wherein preferably the digital code is a gray coded digital signal, and
bb) wherein preferably the relationship between the analogue swept signal and the digital code is changed between a storage ramp and a comparison ramp.

According to bb) above, the stored digital value is determined by the point at which the comparator switches during this storage ramp. The subsequent, differing, comparison ramp and corresponding digital code determine the value which is used to compare to the stored digital value. By providing a different storage ramp and comparison ramp and comparing the digital values for the easily calculable sign of difference of the digital codes, a subtraction function is realised where the size of the subtraction is given by the difference in the ramps.

Example: if digital code A is recorded during the storage ramp and digital code B is read during the comparison ramp, and B≥A, then VSIG during comparison is larger than VSIG during the storage ramp+ the difference between the ramps. In other words, current VSIG, VSIG(B), generated using the comparison ramp equals the sum of the previous VSIG, VSIG(A), and the difference, D, between the storage ramp and the comparison ramp, i.e. we create the result:

$$VSIG(B) > VSIG(A) + D.$$

The difference D may have a positive value or a negative value.

As the generation of the ramps is preferably global, the subtraction function may be globally realised for all pixels, and the implementation is efficient in device area and power consumption. The difference can be freely chosen and may be smaller, the same, or larger than the ramp voltage step between a digital code.

A subtraction function is typically used to implement hysteresis.

The difference between the ramps may vary across the ramp voltage so that the effective difference is dependent on the pixel illumination. This variable difference is again preferably globally realised for all pixels, so the implementation is efficient in device area and power consumption.

As previously stated, the difference D may have a positive value as in the above example or a negative value. Alternatively, the meaning of the storage and comparison ramps may be reversed depending on the pixel state, typically the previous event direction. This enables a difference function with the opposite sign depending on the pixel state. This reversible difference is again preferably globally realised for all pixels, so the implementation is efficient in device area and power consumption.

In other words, the same ramps may be applied to all pixels, say ramp A and ramp B. However, depending on the state of the pixel, that pixel may use ramp A as storage and ramp B as comparison. Other pixels may make a different selection, ramp B as storage and ramp A as comparison. Ramp A is then the storage ramp for some pixels and comparison for others.

Multiple comparison ramps, or multiple storage ramps, are also possible. This allows the sequential comparison against multiple differences, which could be used to determine e.g. large event or small event.

The simplification of the realisation of the difference function in particular enables the direct sign difference calculation of the digital code (stored and comparison) during the ramp. This removes the necessity to memorize the comparison value until the end of the ramp for subsequent comparison.

Furthermore,
a) the swept signal may be a linear ramp, or
b) the swept signal may be a non-linear ramp, or
c) the swept signal may be changed during operation, and/or
d) a period of the swept signal may be changed during operation, and/or
e) the repeats of the swept signal may be interrupted for a short or extended period during operation, and/or
f) a repeat rate of the swept signal may be chosen from one or more repeat rates in correspondence with a light source modulation of the light signal illuminating the photosensor, preferably to increase or suppress an event output.

In particular, under item f) above, a repeat rate of the swept signal may be chosen from one or more repeat rates in correspondence with a light source modulation of the light signal illuminating the photosensor, preferably to increase or suppress a response to a target, e.g. the light source with a given frequency or to suppress a response to a disturbance with a given frequency.

Preferably, the image sensor further comprises at least one reference pixel configured to set the swept ramp limits, wherein preferably the at least one reference pixel is positioned outside the arrangement of pixels, and/or wherein preferably the at least one reference pixel is biased under reference conditions.

Preferably, the digital comparison circuit is configured to perform comparison with the stored level during the sweep of the analogue signal, or the digital comparison circuit is configured to perform comparison with the stored level after the sweep of the analogue signal.

"During the sweep of the analogue signal" and "during the swept analogue signal" may denote the same process.

In particular, if the comparison is performed during the sweep of the analogue signal, the A/D output value does not need to be stored, just the result of the comparison. This results in less memory requirements, but more comparisons. If the comparison is performed after the sweep of the analogue signal, the A/D output value does not need to be stored. This increases the memory requirement but reduces the number of comparisons required.

Preferably,
a) the digital comparison circuit is configured to perform comparison using static logic in the pixel circuit, or
b) the digital comparison circuit is configured to perform comparison using dynamic logic in the pixel circuit, and/or
c) the digital comparison circuit is configured to perform comparison with a hysteresis, and/or
d) the digital comparison circuit is configured to perform comparison requiring a difference which is changed from time to time in operation.

Preferably, the output circuit is configured to generate an output dependent on the comparison result of the comparison circuit in adjacent pixels, or the output circuit is configured to generate an output dependent on a function of adjacent pixels in a fixed configuration or in a configuration which is changed during operation, wherein preferably the function is an average function, and/or the output circuit is configured to generate an output if a rate of change of the comparison of the comparison exceeds a certain threshold.

Preferably,
a) the output circuit is configured to generate an output dependent on the output in adjacent pixels, or
b) the output circuit is configured to generate an output dependent on the stored levels in adjacent pixels, or
c) the output circuit is configured to generate an output dependent on a plurality of stored values.

Preferably,
a) the output circuit is configured to generate an event output indicating the direction of the changed level, and/or
b) the output circuit is configured to generate an event output indicating only a changed level in one direction, and/or
c) the output circuit is configured to generate an event output indicating the magnitude of the changed level, and/or
d) the output circuit is configured to generate an event output indicating the intensity of illumination before and/or after the changed level.

Preferably, a) the digital storage circuit is configured to provide the stored digital representation at output lines of the arrangement of pixels, and/or b) the digital storage circuit is configured to provide the stored digital representation at the output lines of the arrangement of pixels selectively for pixels having an event output, and/or c) the digital storage circuit is configured to provide the stored digital representation at the output lines using event column lines, and/or d) the digital storage circuit is configured to write the stored digital representation to the pixels, and/or e) the digital storage circuit is configured to write the stored digital representation from a data stream, and/or f) wherein the digital storage circuit is configured to write the stored digital representation from a data stream being an event stream.

The output lines may be provided in single or multiple number. They may also be shared between output circuits. There may also be provided an output circuit.

Furthermore, the stored digital representation in the acquisition circuit may also be written from outside the array. A previous output may be written back into the stored pixel digital levels to provide a changing reference for the circuit. The circuit will then only report changes with respect to the reference. Normally image data would represent all of the pixels. An event stream, however, only includes changes, and therefore less data. Writing an event stream back therefore allows for lower data rates.

Preferably, the sensor circuit receives a feedback from the digital storage circuit corresponding to the stored digital level, or the stored digital level of adjacent pixels, and the sensor circuit is configured to generate VSIG depending on the feedback. The A/D circuit may receive feedback from the stored digital level, or the stored digital level of adjacent pixels, and may be configured to adjust the output signal depending on the feedback.

Preferably, the sensor circuit is configured to provide VSIG, and/or the image sensor is constructed of multiple semiconductor layers, wherein each level is optimised for the function of that layer.

In particular, an analogue representation or an analogue level of VSIG may be provided and directly read out from the circuit or the array.

Groups of acquisition circuits may be connected to a common, or multiple common, event output lines.

A group of acquisition circuits may share at least one of the following circuit elements, (a) digital output circuit, (b) digital comparison circuit, (c) additionally digital storage circuit, (d) additionally analogue to digital conversion circuit. The figures are representative, other combinations of shared elements are not excluded.

The disclosure may also encompass an implementation of analogue to digital conversion using a comparator with a swept analogue signal and a digital code.

The present invention provides event generation on a multi silicon layer device, which is not disclosed in Itoh et. al identified above.

In an embodiment, the implementation uses different storage and comparison ramps for the analogue to digital conversion to create an efficient difference function or difference functions. Sharing circuitry between pixels in image sensors (e.g. KR 2020-0029328 A) is critical in image sensor design to create a dense pixel array and a high pixel resolution. The current invention uses digital storage and event calculation in a time sequential manner, which is particularly suited to the sharing of resources between pixels without performance degradation.

Further, the present invention extends the use of the technique disclosed by US 2015/358570 A1 to dynamic vision sensors, where the use of digital storage and processing with a global timing is efficient and the impact in reduction of number of generated events is important to the power consumption and subsequent processing.

The present invention enabled by in-pixel digital storage, may selectively create events based on the stored digital levels (multiple bits) in adjacent pixels. A particular configuration of this selective filtering may be used to achieve the same result as the single bit filtering disclosed by WO 2020/080383 A1.

In addition, in comparison with, e.g., T. Delbruck identified above, the present invention has an inherent time-base due to the A/D conversion technique for reduced time-stamp complexity and enables local, digital, temporal filtering of the events with no further transmission.

The present invention modulates the analogue circuit parameters based on the stored digital level or event output, as this feedback is efficiently realised (surface area) with switches under digital control, which differs from the above described disclosure of EP 3 313 064 A1.

In comparison to EP 2 933 995 A1 described above, the present invention proposes modulation of the analogue circuit parameters based on the locally stored pixel digital level or event output, as this feedback is efficiently realised (surface area) with switches under digital control. This is different in function (pixel local), implementation (digital control) and purpose with respect to EP 2 933 995 A1.

The present invention enables an area optimised (small) pixel structure producing a high resolution and cost optimised sensor using the advantages of digital in-pixel conversion and storage.

Static background subtraction (e.g. WO 2020/229981 A1) is an inherent part of event-based dynamic vision sensing and is realised inside the image sensor. Using digital storage in the image sensor pixel array and providing a write function to that storage, the present invention uses the inherent differencing function of the dynamic vision sensor to provide static or dynamic background (or reference) subtraction and a true event output.

As mentioned above, the fine ramp in WO 2020/229981 A1 can be understood as a zoom of the coarse ramp and the approach can be used to accelerate the ADC conversion. The purpose of the use of the multiple ramps (acceleration of conversion) is different to the present invention (area and power efficient calculation of signal difference) and, in consequence, the nature of the ramps is different (zoomed ramps in WO 2020/229981 A1 versus deliberately shifted ramp in the present invention).

The invention is further described with reference to the figures. Therein,

FIGS. 1 to 4 show exemplary embodiments of the present invention.

FIG. 1 schematically illustrates a first exemplary configuration of a delta image sensor in accordance with the present invention.

Figure 2:
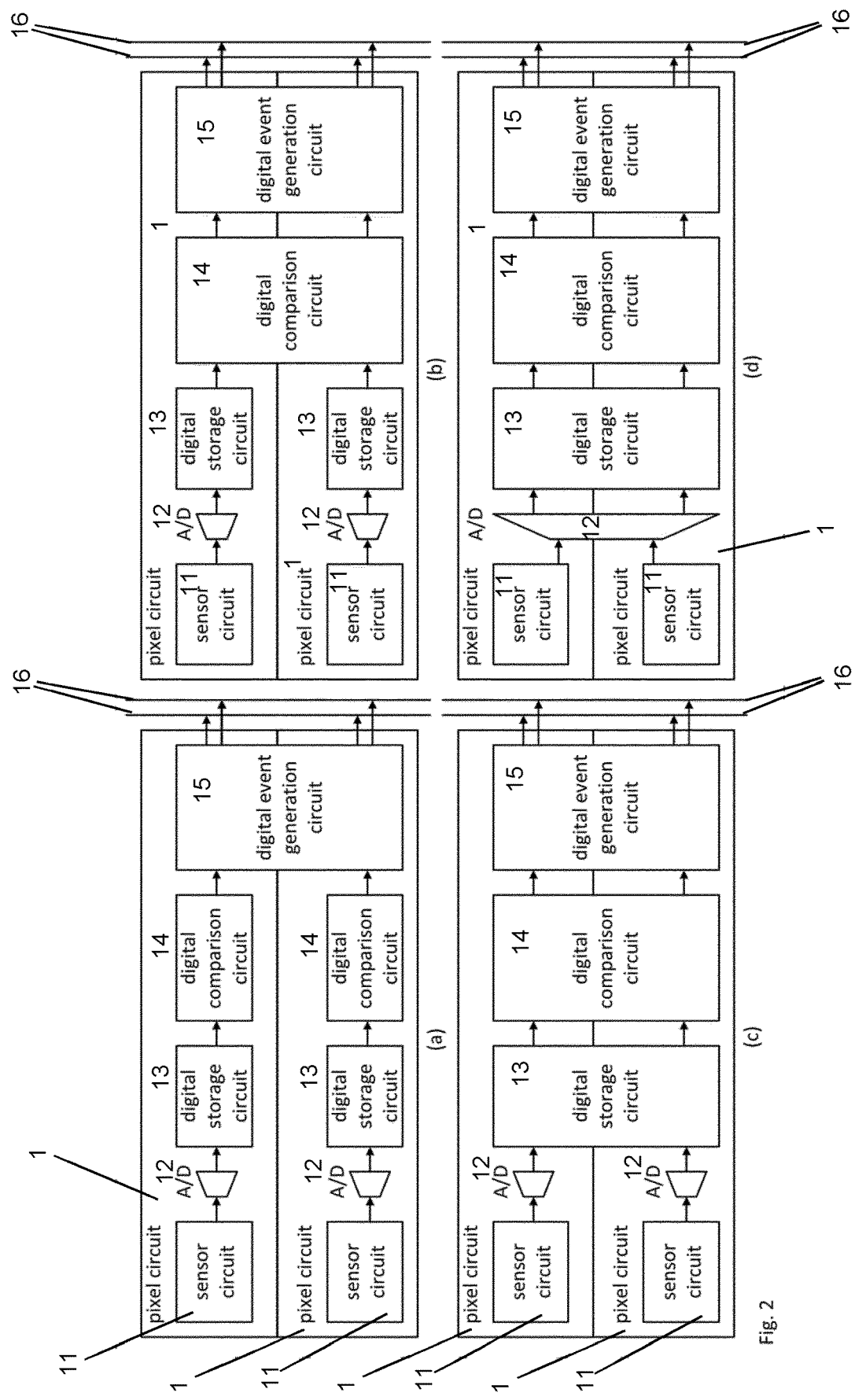

FIG. 2 schematically illustrates further exemplary configurations of a delta image sensor in accordance with the present invention, wherein FIG. 2a shows the sharing of the event generation circuit, FIG. 2b shows the sharing of the event generation circuit and digital comparison circuit, FIG. 2c shows the sharing of event generation circuit, digital comparison circuit and digital storage circuit, FIG. 2d shows the sharing of the event generation circuit, digital comparison circuit, digital storage circuit and A/D conversion circuit.

Figure 3:
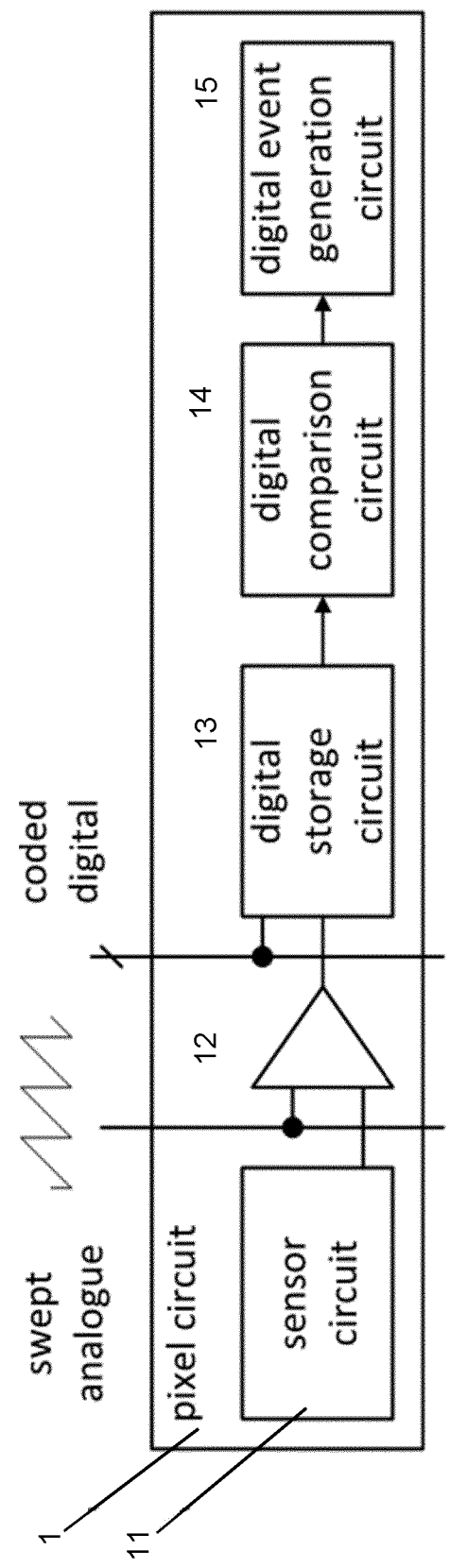

FIG. 3 illustrates an exemplary embodiment, wherein the conversion from analogue (VSIG) to digital representation is carried out using a comparator in a pixel circuit and an analogue swept signal is applied to the pixel circuit.

Figure 4A:
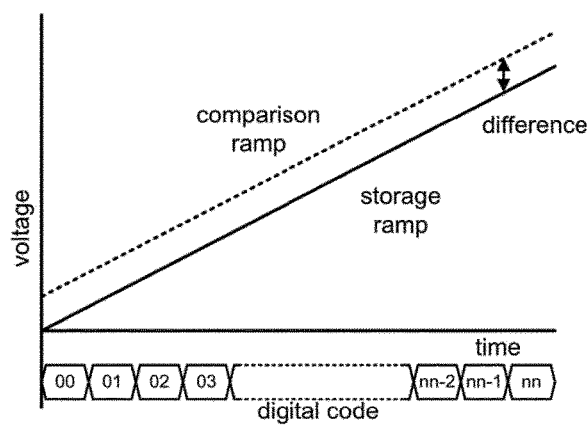

FIGS. 4a, and b are schematic diagrams each showing a comparison ramp and a storage ramp and respective digital codes.

The same reference numerals denote same or similar components in the figures. Redundant description will therefore be omitted.

FIG. 1 schematically illustrates a first exemplary configuration in accordance with the present invention. A delta image sensor, also called image sensor, comprises an arrangement of pixels and at least one acquisition circuit (1). The acquisition circuit (1) may also be called pixel circuit. The circuits are formed as part of an integrated circuit. The acquisition circuit (1) of each pixel comprises at least one sensor circuit (11) comprising a photosensor, which generates a sensor signal (VSIG) dependent on a light signal illuminating the photosensor of the at least one pixel or the illumination intensity and at least one analogue to digital conversion circuit (12, A/D converter). The digital conversion circuit (12) may be connected to the output of the sensor circuit (11). At least one digital storage circuit (13) is configured to store a representation of at least one digital signal corresponding to a previous VSIG. The digital storage circuit (13) may be connected to the output of the A/D converter (12). At least one digital comparison circuit (14) is configured to compare the level of the stored representation with the current VSIG to detect whether a changed level is present. The digital comparison circuit (14) may be connected to the output of the digital storage circuit (13) and the output of A/D converter (12). At least one digital output circuit (15) or digital event generation circuit is configured to generate an event output under the condition of the changed level. The output circuit (15) may be connected to the output of the digital comparison circuit (14).

At least one event output line (16) may be comprised in the pixel circuit (1) or outside the pixel circuit (1) to output the event output from the delta image sensor. The at least one event output line (16) may also be shared by multiple digital output circuits (15).

This first exemplary pixel configuration enables the detection of a changed illumination intensity over an interval. Where the digital comparison circuit (14) detects a difference in the digital representation of the stored signal and the digital representation after the interval and this difference meets a given criterion, an event is generated and the fact of the change is reported as event information at the output of the image sensor.

A digital storage of the level may be preferential in a range of applications, as (i) the stored level does not degrade with time, (ii) the storage circuit (13) can be physically smaller, (iii) the value can be easily used in adjacent cells, (iv) the value can be more flexibly used to the realisation of combination functions with other pixels or previous values.

In a further exemplary configuration, as illustrated in FIG. 2, parts of the pixel circuit are shared between sub-set of pixels. The use of the shared elements is then carried out in a time sequential manner.

FIG. 2a shows the sharing of the event generation circuit (15), FIG. 2b the sharing of the event generation circuit (15) and digital comparison circuit (14), FIG. 2c the sharing of event generation circuit (15), digital comparison circuit (14) and digital storage circuit (13), FIG. 2d the sharing of the event generation circuit (15), digital comparison circuit (14), digital storage circuit (13) and A/D conversion circuit (13).

Please note that other sharing configurations are possible and the above listing does not exclude these possibilities. It is also possible to share different functions to a different extent, e.g. the A/D conversion circuit (12) over 4 pixels and the event generation circuit (15) over 16 pixels. Other configurations may also be advantageous.

One exemplary embodiment of the invention converts the optical illumination intensity signal to an analogue electrical signal with a linear relationship. This embodiment is advantageous at low light illumination levels which integrate the charge on a photodiode mode and use commercial standard cells optimised for image capture applications.

A further exemplary embodiment of the invention converts the optical illumination intensity signal to an analogue electrical signal with a logarithmic relationship. This embodiment is advantageous with a high dynamic range of optical illumination signals as the output analogue signal does not saturate over a wide range of illumination intensities.

A further exemplary embodiment of the invention uses a combination of conversion using linear and logarithmic functions, or similar non-linear function combinations as a response curve. This embodiment is advantageous to enable both good low light illumination performance and a high dynamic range. A first embodiment uses a fixed configuration with a combined function.

A further exemplary embodiment allows a configuration so that the response curve is changed during operation for the full arrangement of pixels. This is preferably carried out dependent on the global illumination conditions or operating mode of the image sensor application.

A further embodiment allows a configuration so that the response curve is changed during operation independently for subsets of pixels. This is preferably carried out dependent on the local illumination conditions or focus of attention of the image sensor application.

FIGS. 4 a, and b are schematic diagrams each showing a comparison ramp and a storage ramp and respective digital codes. Each ramp is generated as a voltage which varies with time together with a digital code which varies at intervals during the ramp. The storage and comparison ramps are generated sequentially (not at the same time).

In FIG. 4a both the comparison ramp and the storage ramp are linear and shown as parallel lines with a constant difference.

Figure 4B:
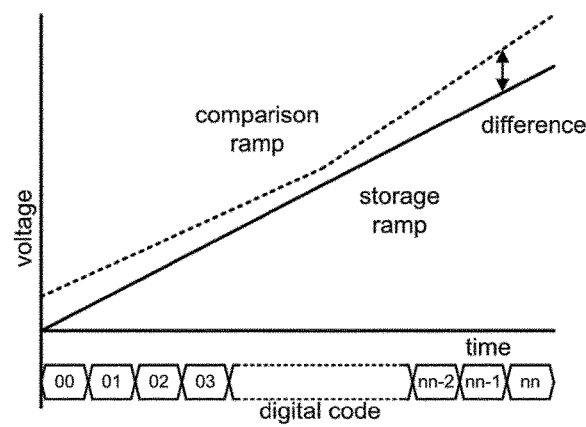

In FIG. 4b the comparison ramp comprises two linear parts, wherein the first part has a smaller slope and the second part has a larger slope. In this example the storage ramp is linear. As shown in FIG. 4b the difference between the storage ramp and the comparison ramp varies. In the region of the first part of the comparison ramp the difference becomes smaller with larger digital codes and in the region of the second part of the comparison ramp the difference becomes larger. This form is exemplary and other forms may be used.

As discussed above, the stored digital value is determined by the point at which the comparator switches during this storage ramp. The subsequent, differing, comparison ramp and corresponding digital code determine the value which is used to compare to the stored digital value. By providing a different storage ramp and comparison ramp and comparing the digital values for the easily calculable sign of difference of the digital codes, a subtraction function is realised where the size of the subtraction is given by the difference in the ramps.

As shown in the example of FIG. 4a if digital code A, for example "02", is recorded during the storage ramp and digital code B, for example "03" is read during the comparison ramp, and B≥A, then VSIG during comparison is larger than VSIG during the storage ramp+ the difference between the ramps. In other words, current VSIG, VSIG(B), measured during the comparison ramp is larger than the sum of the previous VSIG, VSIG(A), and the difference, D, between the storage ramp and the comparison ramp, i.e.

$$VSIG(B) > VSIG(A) + D.$$

The difference D may have a positive value or a negative value.

As the generation of the ramps is preferably global, the subtraction function may be globally realised for all pixels, and the implementation is efficient in device area and power consumption. The difference can be freely chosen and may be smaller, the same, or larger than the ramp voltage step between a digital code.

A subtraction function is typically used to implement hysteresis.

The difference between the ramps may vary as shown in FIG. 4b across the ramp voltage so that the effective difference is dependent on the pixel illumination. This variable difference is again preferably globally realised for all pixels, so the implementation is efficient in device area and power consumption.

As previously stated, the difference D may have a positive value as in the above example or a negative value. Alternatively, the meaning of the storage and comparison ramps may be reversed depending on the pixel state, typically the previous event direction. This enables a difference function with the opposite sign depending on the pixel state. This reversible difference is again preferably globally realised for all pixels, so the implementation is efficient in device area and power consumption.

In other words, the same ramps may be applied to all pixels, say ramp A and ramp B. However, depending on the state of the pixel, that pixel may use ramp A as storage and ramp B as comparison. Other pixels may make a different selection, B as storage and A as comparison. Ramp A is then the storage ramp for some pixels and comparison for others.

Multiple comparison ramps, or multiple storage ramps, are also possible. This allows the sequential comparison against multiple differences, which could be used to determine e.g. large event or small event.

The simplification of the realisation of the difference function in particular enables the direct sign difference calculation of the digital code (stored and comparison) during the ramp. This removes the necessity to memorize the comparison value until the end of the ramp for subsequent comparison.

In one exemplary embodiment, according to FIG. 3, the conversion from analogue (VSIG) to digital representation is carried out using a comparator in the pixel circuit (1) and analogue swept signal applied to the pixel circuit. A digital representation is copied to the digital storage circuit (13) dependent on the point at which the comparator output toggles.

In a derived embodiment, the analogue swept signal is a linear ramp; in a further embodiment the analogue swept signal is a non-linear ramp, e.g. an exponential ramp.

As the swept signal may be generated centrally, the implementation of a non-linear ramp is advantageous as the additional complexity for this circuit is only required once on the device, providing (i) an area saving and (ii) matched function for all pixels.

In particular the modification of the ramp may be used to compensate for non-idealities in the sensor circuit (11), or for variation over temperature or other environmental conditions.

In particular, the modification may be carried out by analogue or digital means.

In particular, the modification may be carried out with reference to test cells on the device. This implementation is advantageous as the compensation of non-idealities reflected in the test cells is automatic.

In one exemplary embodiment, the same analogue swept ramp is provided simultaneously to the entire pixel arrangement. In a derived embodiment, different analogue swept ramps are applied to subsets of the arrangement.

The use of different ramps is advantageous where the characteristics of the sensor circuits (11) vary across the pixel arrangement (deliberate cell variation or due to process or optical configuration) and this variation is compensated with the provision of different ramps.

In a further embodiment the analogue swept ramp is modified according to the operating mode of the image sensor from time to time during operation.

In one exemplary embodiment, a changing digital code is provided simultaneously with the analogue ramp. The digital code stored in the digital storage circuit (13) is the value of the digital code when the comparator output toggles. In a first embodiment, the code is a binary code.

In a derived embodiment the digital code is a gray code. A gray code is advantageous as (i) synchronisation with the digital storage is not required as only one edge changes at a time and the codes either side of the edge are valid and (ii) the gray code has fewer edges over a cycle and the power consumption is reduced.

In a derived embodiment the analogue and digital code sweeps are separated sequentially into storage and comparison sweeps, or multiple comparison sweeps. The relationship between the analogue signal level and the digital code is varied between the reference and comparison sweeps. This approach is advantageous as a simpler digital comparison logic is required in the pixel. This might reduce the required area.

In a derived embodiment, a different relationship between the analogue swept level and the digital code is created for different subsets of pixels.

This approach is advantageous as a digital code can be varied in either (i) calculation or in (ii) timing with a digital circuit. This provides an area saving over the generation of multiple analogue ramps and improved flexibility and enables the compensation or change of function of sub-sets of the arrangement of pixels.

In one exemplary embodiment, the digital comparison between the stored level and the current level is carried out continuously during the analogue sweep. The comparison result is related to the timing of the toggling of the analogue comparator output and the digital comparison. In this embodiment the implementation of hysteresis, or differing event generation thresholds, is carried out based on the relative timing.

In one exemplary embodiment the variation in timing is generated based on a clock. In a further exemplary embodiment, the variation is generated with a timer circuit within the pixel circuit.

In a further exemplary embodiment, the digital comparison between the stored level and the current level is carried out following the analogue voltage sweep. This embodiment is advantageous where the logic can use sequential, e.g. bitwise, elements repeatedly providing a silicon area saving.

In one exemplary embodiment the sequential logic is performed with static logic.

In a further exemplary embodiment, the sequential logic is performed with dynamic logic. In a derived embodiment the digital comparison is carried out with feedback from the previous result. This is typically used to implement hysteresis in the comparison and is advantageous in the suppression of noise and reduction of spurious events.

In a derived embodiment the digital comparison and event generation is carried out requiring a different difference (>1) in order to generate an event. This may be advantageous to (i) reduce the number of events, or to (ii) improve the resolution of the production of events.

The required difference may be dependent on (i) the signal level (ii) the operation mode, e.g. region of interest (iii) the adjacent pixels levels (iv) the pixel previous levels (v) the pixel previous events (vi) the events of adjacent pixels.

In a derived embodiment a rate of event generation below a certain rate is suppressed within the pixel circuit. This is advantageous as this information is less useful for subsequent image processing and the event suppression reduces the power and processing requirement.

In one exemplary embodiment, the digital condition for event generation is dependent on the event generation of adjacent pixel circuits. This operation enables, for example, filtering of the events to reduce the number of spurious events.

In one exemplary embodiment, the digital condition for event generation is dependent on the stored levels of adjacent pixel circuits. This operation enables, for example, filtering of the events to provide increased sensitivity near to an edge.

In one exemplary embodiment, the digital condition for event generation is dependent on multiple stored levels of the pixel circuit. This operation enables, for example, filtering of analogue noise to reduce the number of spurious events.

In one exemplary embodiment, the sample rate is chosen to synchronise with the flicker frequency of a disturbing light source. This is advantageous as it allows the suppression of events due to this light source.

In one exemplary embodiment, the event output is a single event bit, e.g. up event, no event. In other words, the up event corresponds to an increased light intensity.

In a further embodiment, the event output is a two bit, e.g. up and down. In other words, the event output may indicate whether the light intensity or sensor signal VSIG is bigger or smaller than the stored light intensity level or stored VSIG.

In a further exemplary embodiment, the event output includes the digital representation of the magnitude of the change. This embodiment is advantageous as it enables the perfect reconstruction of the image from the event information.

In a further exemplary embodiment, the event output includes the illumination intensity representation before and/or after the change. In one embodiment it is additionally possible to read out the level of the stored values in the pixel array.

In a derived embodiment the digital stored values from a target area selectively read, i.e. via random access.

In a further exemplary embodiment, the digital level is read over the existing common event output lines. In one embodiment the stored digital levels can be written into the arrangement of pixels to provide a new or intentionally modified reference for comparison. In a derived embodiment, a stream of data is written into the stored digital levels to intentionally provide a time dependent reference for event generation.

In related derived embodiment, the stream of data is an event stream similar to that normally generated by the sensor.

In one embodiment the sensor circuit (11) has a feedback from the stored digital level, or the stored digital level of the adjacent pixels, to adjust the VSIG level of that pixel. This embodiment may be advantageous to realise, e.g. a hysteresis function, in a minimal surface area.

In one exemplary embodiment the comparator circuit has a feedback from the stored digital level, or the stored digital level of the adjacent pixels, to adjust the function of the comparator, typically to add an offset. This embodiment may be advantageous to realise, e.g. a hysteresis function, in a minimal surface area.

In one exemplary embodiment the sample rate is electrically configurable or electrically changed from time to time in operation.

The power consumption and event generation rate may be dependent on the sample rate. Reducing the sample rate enables a very low power mode under quiet conditions. Additionally, a low sample rate in combination with integrating sensor circuit (11) behaviour enables operation in low light conditions.

In one exemplary embodiment the sampling is entirely interrupted for an extended period.

The power consumption and event generation rate may be dependent on the sample rate. Interrupting the sampling for a period, e.g. 1s, enables very low power operation, but due to the digital storage retains the fidelity of the recorded image.

In one exemplary embodiment, the analogue signal levels (VSIG) can be read out of the pixel arrangement. This embodiment may be realised using the common event column lines.

In one exemplary embodiment the image sensor is constructed of multiple semiconductor layers, where the semiconductor process type of each level is optimised for the function of that layer. This implementation is advantageous as the optimisation for function of the semiconductor processes allows (i) improvements in performance, (ii) reduction of silicon area and following (ii) a) device size and (ii) b) device cost. The altered physical structure improves the optical performance for (i) fill factor (ii) quantum efficiency and reduces electrical disturbance between controlling signal lines and the photosensor circuit.

The plurality of pixels is typically organised in a two dimensional grid with "rows" and "columns". It should be noted that the definition of "rows" and "columns" can be interchanged without affecting the invention. It should also be noted that other geometrical configurations are possible which map to a two dimensional grid, without impacting the applicability of the invention.

Finally, it should be noted that the term "comprising" does not exclude other elements or steps and the "a" or "an" does not exclude a plurality. Also, elements described in association with different embodiments may be combined. It should also be noted that reference signs in the claims should not be construed as limiting the scope of the claims.

The invention claimed is:

1. A delta image sensor comprising an arrangement of pixels and a plurality of acquisition circuits corresponding to at least one pixel of the arrangement of pixels and formed as part of an integrated circuit, each acquisition circuit including:
- at least one sensor circuit comprising a photosensor configured to generate a sensor signal, VSIG, depending on a light signal illuminating the photosensor;
- at least one analogue to digital conversion, A/D, circuit configured to generate a digital representation corresponding to a current sensor signal VSIG, wherein the A/D circuit is configured to use one of a plurality of ramps to generate the digital representation;
- at least one digital storage circuit configured to store a representation of at least one digital signal generated using a storage ramp which constitutes one of the plurality of ramps, the representation corresponding to a previous sensor signal VSIG;
- at least one digital comparison circuit configured to compare a level of the stored digital representation with the digital representation of the current sensor signal VSIG, being generated using a comparison ramp which constitutes a different one of the plurality of ramps than the storage ramp, to detect whether a changed level is present; and
- at least one digital output circuit configured to generate an event output under a condition of the changed level.

2. The image sensor of claim 1, wherein a relationship between an analogue swept signal and a digital code is changed between a storage ramp and a comparison ramp or wherein the storage ramp and the comparison ramp have a fixed voltage difference.

3. The image sensor of claim 2, wherein a use of the storage ramp and the comparison ramp is reversed by the at least one pixel depending on a pixel state of the at least one pixel.

4. The image sensor of the claim 2, wherein the at least one digital comparison circuit is configured to carry out the comparison of the level of the stored representation with the current sensor signal VSIG during at least one of the ramps.

5. The image sensor of claim 2, wherein the at least one digital comparison circuit is configured to carry out the comparison of the level of the stored representation with the current sensor signal VSIG after the ramp.

6. The image sensor of claim 1, wherein a relationship between an analogue swept signal and a digital code is changed between a storage ramp and a comparison ramp or wherein the storage ramp and the comparison ramp have a variable voltage difference depending on a voltage level of current sensor signal VSIG.

7. The image sensor according to claim 1, wherein one or more storage ramps and one or more comparison ramps are applied and used by the at least one pixel, depending on a state of the at least one pixel, to provide multiple difference functions.

8. The image sensor of claim 1, wherein one or more storage ramps and one or more comparison ramps are applied and used by the at least one pixel, independent of a state of the at least one pixel, to provide multiple difference functions.

9. The image sensor of claim 1, wherein the at least one pixel comprises at least two pixels, and wherein each acquisition circuit is shared between the at least two pixels.

10. The image sensor of claim 1, wherein the at least one sensor circuit is configured to generate be sensor signal VSIG based on one of the following relationships:
a) a linear dependency on an intensity of the light signal,
b) a non-linear dependency on an intensity of the light signal, and
c) a combination of a non-linear and a linear dependency on an intensity of the light signal.

11. The image sensor claim 10, wherein the at least one sensor circuit is configured to change the dependency of the sensor signal VSIG on the intensity of the light signal in response to a control signal during operation or
wherein the sensor circuit is configured to change the dependency of the sensor signal VSIG on the intensity of the light signal in response to a control signal during operation individually for at least one of the pixel or collectively for a subset of the pixel.

12. The image sensor of claim 1,
a) wherein the at least one analogue to digital conversion circuit comprises a comparator, which is configured to compare the current sensor signal VSIG with one of the following swept signals:
   aa) a swept analogue input signal, and
   ab) a sequence of swept analogue input signals, where each of the swept analogue signals provides a different difference function, or
b) wherein the at least one analogue to digital conversion circuit is further configured to provide at least one digital code in parallel with a swept analogue signal to the at least one pixel.

13. The image sensor according to claim 12,
a) wherein the swept signal or sequence of swept signals is characterized by a linear ramp, or
b) wherein the swept signal or sequence of signals is characterized by a non-linear ramp, or
c) wherein the swept signal or sequence of swept signals is changed during operation, and/or
d) wherein a period of the swept signal or sequence of swept signals is changed during operation, or
e) wherein the repeats of the swept signal or sequence of swept signals can be interrupted for a short or extended period during operation, or
f) wherein a repeat rate of the swept signal or sequence of swept signals is chosen from one or more repeat rates in correspondence with a modulation of the light signal illuminating the photosensor.

14. The image sensor according to claim 12, wherein the image sensor further comprises at least one reference pixel configured to set ramp limits of the swept signal or each swept signal of the sequence of swept signal.

15. The image sensor of claim 1,
a) wherein the at least one digital comparison circuit is configured to perform the comparison using static logic, or
b) wherein the at least one digital comparison circuit is configured to perform the comparison using dynamic logic, or
c) wherein the at least one digital comparison circuit is configured to perform the comparison with a hysteresis, or
d) wherein the at least one digital comparison circuit is configured to perform the comparison requiring a difference which is changed as a function of time.

16. The image sensor of claim 1, wherein the at least one output circuit is configured to generate the event output dependent on a comparison result of the at least one comparison circuit in adjacent pixels of the at least one pixel, or
wherein the at least one output circuit is configured to generate the event output dependent on a function of adjacent pixels of the at least one pixel in a fixed configuration or in a configuration which is changed during operation, or wherein the at least one output circuit is configured to generate the event output if a rate of change of the comparison exceeds a certain threshold.

17. The image sensor of claim 1,
a) wherein the at least one output circuit is configured to generate the event output dependent on comparison results in adjacent pixels of the at least one pixel, or
b) wherein the at least one output circuit is configured to generate the event output dependent on the stored levels in adjacent pixels of the at least one pixel, or
c) wherein the at least one output circuit is configured to generate the event output dependent on a plurality of stored values.

18. Image sensor of claim 1,
a) wherein the at least one output circuit is configured to generate the event output indicating a direction of a changed level, or
b) wherein the at least one output circuit is configured to generate the event output indicating only a changed level in one direction, or
c) wherein the at least one output circuit is configured to generate the event output indicating a magnitude of a changed level, or
d) wherein the at least one output circuit is configured to generate the event output indicating an intensity of the light signal before or after a changed level.

19. The image sensor of claim 1,
a) wherein the at least one digital storage circuit is configured to provide the stored digital representation at output lines of the arrangement of pixels, or
b) wherein the at least one digital storage circuit is configured to provide the stored digital representation at output lines of the arrangement of pixels selectively for pixels of the arrangement of pixels having an event output, or
c) wherein the at least one digital storage circuit is configured to provide the stored digital representation at output lines using event column lines, or
d) wherein the at least one digital storage circuit is configured to write the at least one stored digital representation to the at least one pixel, or
e) wherein the at least one digital storage circuit is configured to write the at least one stored digital representation from a data stream, or
f) wherein the at least one digital storage circuit is configured to write the stored digital representation from a data stream that is an event stream.

20. The image sensor of claim 1, wherein the at least one sensor circuit receives a feedback from the at least one digital storage circuit corresponding to the level of the stored digital representation, or the level of the stored digital representations of adjacent pixel of the arrangement of pixel, and the at least one sensor circuit is configured to generate sensor signal VSIG depending on the feedback, or
wherein the A/D circuit receives feedback regarding the level of the stored digital representation or the level of the stored digital representation of adjacent pixel of the arrangement of pixels, and is configured to adjust an output signal depending on the feedback.

21. The image sensor of claim 1, wherein the at least one sensor circuit is configured to provide an analogue representation of sensor signal VSIG, or
wherein the image sensor is constructed of multiple semiconductor layers, wherein each level is optimised for a function of that layer.

* * * * *